United States Patent [19]
Distefano et al.

[11] Patent Number: 5,390,844
[45] Date of Patent: Feb. 21, 1995

[54] SEMICONDUCTOR INNER LEAD BONDING TOOL

[75] Inventors: Thomas H. Distefano, Bronxville; Igor Y. Khandros, Peekskill; Gaetan Mathiew, Carmel; Jason Sweis, Ossining; John Grange, Red Hook; Gary W. Grube, Monroe, all of N.Y.

[73] Assignee: Tessera, Inc., Elmsford, N.Y.

[21] Appl. No.: 96,700

[22] Filed: Jul. 23, 1993

[51] Int. Cl.⁶ ............................................. H05K 3/32
[52] U.S. Cl. ................. 228/180.21; 228/212; 228/49.5
[58] Field of Search ............ 228/110.1, 180.21, 180.5, 228/212, 1.1, 6.2, 44.7, 49.5, 52

[56] References Cited

U.S. PATENT DOCUMENTS

| 4,069,961 | 1/1978 | Nicklaus et al. | 228/4.5 |
| 4,776,509 | 10/1988 | Pitts et al. | 228/1.1 |
| 4,887,758 | 12/1989 | Suzuki et al. | 228/6.2 |
| 5,007,576 | 4/1991 | Congleton et al. | 228/103 |
| 5,059,559 | 10/1991 | Takahashi et al. | 219/56.1 |
| 5,148,967 | 9/1992 | Gabaldon et al. | 228/103 |
| 5,156,318 | 10/1992 | Suzuki et al. | 228/4.5 |
| 5,193,732 | 3/1993 | Interrante et al. | 228/4.5 |
| 5,217,154 | 6/1993 | Elwood et al. | 228/45 |

FOREIGN PATENT DOCUMENTS

| 0506112 | 9/1992 | European Pat. Off. |
| 4142050 | 5/1992 | Japan. |
| 4155935 | 5/1992 | Japan. |
| 4162543 | 6/1992 | Japan. |
| 4245450 | 9/1992 | Japan. |
| 4287939 | 10/1992 | Japan. |

Primary Examiner—Samuel M. Heinrich
Attorney, Agent, or Firm—Lerner, David, Littenberg, Krumholz & Mentlik

[57] ABSTRACT

A bonding tool for bonding inner leads to semiconductor chips is arranged to capture and align elongated lead sections extending in any one of plural directions, and preferably, in any one of two mutually orthogonal directions. Thus, the tool can be applied to align and bond all of the leads to a chip without turning the tool or the chip even where the leads extend in multiple directions.

19 Claims, 6 Drawing Sheets

SEMICONDUCTOR INNER LEAD BONDING TOOL

FIELD OF THE INVENTION

The present invention relates to the field of semiconductor chip mounting and connection, and more particularly relates to tools and methods for bonding electrical leads to contacts on a semiconductor chip.

BACKGROUND OF THE INVENTION

Semiconductor chips typically are connected to external circuitry through contacts on a surface of the chip. The contacts on the chip typically are disposed in the regular patterns such as a grid substantially covering the front surface of the chip, commonly referred to as an "area array" or in elongated rows extending parallel to and adjacent each edge of the chip front surface. Each contact on the chip must be connected to external circuitry, such as the circuitry of a supporting substrate or circuit panel. Various processes for making these interconnections use prefabricated arrays of leads or discrete wires. For example, in a wirebonding process, the chip is physically mounted on the substrate. A fine wire is fed through a bonding tool. The tool is brought into engagement with the contact on the chip so as to bond the wire to the contact. The tool is then moved to a connection point of the circuit on the substrate, so that a small piece of wire is dispensed and formed into a lead, and connected to the substrate. This process is repeated for every contact on the chip.

In the so-called tape automated bonding or "TAB" process, a dielectric supporting tape, such as a thin foil of polyimide is provided with a hole slightly larger than the chip. An array of metallic leads is provided on one surface of the dielectric film. These leads extend inwardly from around the hole towards the edges of the hole. Each lead has an innermost end projecting inwardly, beyond the edge of the hole. The innermost ends of the leads are arranged side by side at spacing corresponding to the spacings of the contacts on the chip. The dielectric film is juxtaposed with the chip so that hole is aligned with the chip and so that the innermost ends of the leads will extend over the front or contact bearing surface on the chip. The innermost ends of the leads are then bonded to the contacts of the chip, as by ultrasonic or thermocompression bonding. The outer ends of the leads are connected to external circuitry.

In a so-called "beam lead" process, the chip is provided with individual leads extending from contacts on the front surface of the chip outwardly beyond the edges of the chip. The chip is positioned on a substrate with the outermost ends of the individual leads protruding over contacts on the substrate. The leads are then engaged with the contacts and bonded thereto so as to connect the contacts on the chip with contacts on the substrate.

The rapid evolution of a semiconductor art in recent years has created a continued demand for progressively greater numbers of contacts and leads in a given amount of space. An individual chip may require hundreds or even thousands of contacts, all within the area of the chip front surface. For example, a complex semiconductor chip in current practice may have a row of contacts spaced apart from one another at center-to-center distances of 0.5 mm or less and, in some cases, 0.1 mm or less. These distances are expected to decrease progressively with continued progress in the art of semiconductor fabrication.

With such closely-spaced contacts, the leads connected to the chip contacts, such as the wires used in wirebonding leads in the tab process and beam leads must be extremely fine structures, typically less than 0.5 mm wide. Such fine structures are susceptible to damage and deformation. With closely spaced contacts, even minor deviation of a lead from its normal position will result in misalignment of the leads and contacts. Thus, a given lead may be out of alignment with the proper contact on the chip or substrate, or else it may be erroneously aligned with an adjacent contact. Either condition will yield a defective chip assembly. Errors of this nature materially reduce the yield of good devices and introduce defects into the product stream. These problems are particularly acute with those chips having relatively fine contact spacings and small distances between adjacent contacts.

Copending, commonly assigned U.S. patent application 07/919,772, filed Jul. 24, 1992 (the "772 application"), the disclosure of which is incorporated by reference herein, describes an improved system for connecting semiconductor chips to external circuitry. Certain embodiments of the invention set forth in the '772 application utilize a connection component having a support structure and electrically conductive leads. Each lead has a connection section extending across a gap in the support structure. The connection sections of the leads are flexible. Preferably, one end of each lead is detachably secured to the support structure, whereas the other end is permanently secured to the support structure and connected to a terminal mounted on the support structure. The connection component is positioned on a part of a semiconductor chip assembly, such as the chip itself, so that the leads overlie contacts on the part or chip. The connection sections of the leads are bonded to the contacts on the chip by engaging each connection section with a tool, forcing the tool downwardly to break the detachable end of the lead from the support structure and bring the connection section into engagement with a contact on the chip. The tool is used to apply heat and/or ultrasonic vibrations to the lead, thereby forming a bond between the lead and the contact of the chip. This process is repeated for each lead, until all the leads have been bonded to the contacts on the chip. After the connection component has been electrically connected to the contacts of the chip, the terminals of the connections component can be used to connect the chip to other, external circuitry as, for example, by bonding the terminals of the connection component to an external substrate such as a circuit panel.

In the preferred arrangements disclosed in the '772 application, the bonding tool is arranged to capture and align the lead. Thus, the bonding tool may be a blade-like device with an elongated bottom edge and with a groove extending lengthwise along such bottom edge for engaging leads to be bonded. The groove may have a central plane and surfaces sloping upwardly from the sides of the groove towards the central plane. When the tool is roughly aligned with a lead, so that the lengthwise axis of the bottom edge and groove are generally parallel to the lengthwise axis of the connection section of the lead, the groove will engage the lead and guide it into precise alignment with the tool. Thus, the tool can be aligned in sequence with each contact, and engaged with a lead. Even if the lead is slightly out of alignment with the contact and tool at the beginning of the operation, the tool will bring the lead into precise alignment with the tool and hence with the contact during the downward motion of the tool. Thus, minor dimensional variations in the connection component do not impede the process, even where the contacts are provided at very small spacings.

The preferred embodiments described in the '772 application are highly advantageous, but still further improvement would be desirable. In many cases, the connection sections of different leads extend in different, mutually orthogonal directions. For example, many common chips are generally rectangular and have contacts disposed in rows extending along the edges of the chip. The rows of contacts on adjacent edges extend in mutually orthogonal directions. The connection sections of the leads associated with each row of contacts on the chip must be arranged side by side, so that the connection sections of the leads extend orthogonally to the length of the row. Thus, where the rows of contacts extend in mutually orthogonal directions along different edges of the chip, the connection sections of the leads likewise extend in mutually orthogonal directions. Typically, the tool is positioned so that the lengthwise axis of the bottom edge extends parallel to the connection sections in one row, and the tool is then advanced stepwise down the row, bonding each of the leads in the row seriatim. When the row is completed, the chip and support structure must be rotated 90° relative to the tool so as to properly align the tool for engagement with the connection sections of the next row.

The rotation step consumes appreciable time in production and requires that the apparatus be equipped with a precise, rotatable stage or mounting. Moreover, the rotation step can introduce additional misalignments between the connection sections and the tool. Accordingly, it would be desirable if tools and methods could be provided which incorporate the advantages of the preferred embodiments disclosed in the '772 application but which avoid the need for the rotation step and mechanism.

SUMMARY OF THE INVENTION

The present invention addresses the needs.

One aspect of the present invention provides a tool for bonding leads to contacts on semiconductor chips. The tool has a body with a lower end surface including a bonding surface region. The lower end of the tool further defines guide surfaces for engaging elongated leads disposed beneath the lower end of the tool upon downward movement of the tool from above the leads. The guide surfaces are adapted to engage an elongated lead extending generally in a first horizontal direction beneath the lower end and to guide any such lead generally in a second horizontal direction orthogonal to the first direction so as to align the lead with the bonding region of the lower end. The guide surfaces are also adapted to engage an elongated lead extending generally in the second horizontal direction beneath the lower end and to guide the lead generally in the first horizontal direction so as to align such a lead with the bonding region. Stated another way, the guide surfaces are adapted to engage a lead extending in either of two mutually orthogonal directions and to center the engaged lead beneath the bonding region of the lower end so that the lead can be engaged and bonded by the tool. Thus, a tool according to preferred aspects of the present invention will operate on leads extending in either of two mutually orthogonal directions relative to the tool. With either orientation of the lead, the tool will capture and align the lead, and bring the lead into position for bonding. Thus, a tool in accordance with this aspect of the present invention can be used in procedures generally similar to those discussed above with reference to the '772 application. However, where the leads on the connection component extend in two mutually orthogonal directions, there is no need to rotate the connection component and chip relative to the tool during the process. Where the contacts are arranged in rows, the tool can simply be advanced along one row, then advanced along another row, until the process is complete.

A tool according to this aspect of the present invention may have an asperity or projection on its bonding region for coupling the tool to the lead when the lower surface of the tool is forcibly engaged with the lead. The body of the tool may define mutually orthogonal first and second axes extending through the bonding region in first and second, mutually orthogonal horizontal directions. The body of the tool may have four downward projections spaced apart from one another in the first and second horizontal direction so that the projections surround the bonding region and so that two such projections are disposed on each side of each of the aforementioned axes. The guide surfaces may include a pair of first guide surfaces disposed on opposite sides of the bonding region. Each first guide surface may extend across the first axis and slope upwardly from projections on opposite sides of the first axis to a central region adjacent the first axis. Likewise, the guide surfaces may include two second guide surfaces disposed on opposite sides of the bonding region. Each second guide surface may extend across the second axis and may slope upwardly from projections on opposite sides of the second axis to a central region adjacent the second axis. These first and second guide surfaces may have generally arcuate edges bounding the surfaces on the sides of the surfaces remote from the bonding region, i.e., at the edges of the tool body surface. The projections may define ramp surfaces sloping upwardly and inwardly from the projections towards the bonding region of the lower surface. Thus, each ramp surface may define a normal vector (a vector perpendicular to the surface itself) and the surface may be configured such that the normal vector, and the projection of the normal vector in a horizontal plane, lie at an oblique angle to the first and second axes.

According to a further aspect of the invention, the body may likewise define two orthogonal first and second axes extending through the bonding region in first and second horizontal directions, and the guide surfaces may include a pair of first guide surfaces extending generally along the first axis, each such first guide surface flaring progressively outwardly, away from the first axis, with progressively increasing distance from the bonding region. Likewise, the body may further define a pair of second guide surfaces extending along the second axis and flaring progressively outwardly, away from the second axis, with increasing distance from the bonding region. The first and second guide surfaces may be generally in the form of partial surfaces of revolution about the first end and second axes. These surfaces of revolution may be configured such that the radii of these surfaces of revolution about their respective axes increase progressively with distance from the bonding region. The tool may further include ribs extending at oblique angels to the first and second axes, between the first and second guide surfaces, and these ribs may have surfaces sloping downwardly with progressively increasing distance along the ribs from the bonding region. Also, the body of the tool may further define first and second downwardly facing channels on the lower end of the tool, the channels extending in the first and second horizontal directions and hence extending along the first and second axes, these channels extending through the bonding region and intersecting one another in the bonding region. Desirably, the channels merge with the first and second guide surfaces.

Preferably, the lower end of the body has horizontal dimensions in the directions of the axes less than about 0.3 mm and most preferably between about 0.05 mm and about 0.3 mm.

A further aspect of the present invention provides methods of making connections to contacts on the front surface of part of a semiconductor chip assembly. Typically, the contact bearing part is the chip itself. Preferred methods according to this aspect of the present invention desirably include the step of juxtaposing a connection component with leads having elongated connection sections extending in mutually orthogonal first and second directions with the part of the assembly, such as the chip, to be connected so that the connection sections of the leads overlie contacts on the part in crude alignment therewith. Desirably, the method includes the step of bonding the connection section of each lead to one contact on the part by aligning a tool with the contact to be bonded and by displacing the tool downwardly to engage the lead with the tool and thereby bring the connection section into more precise alignment with the contact, and continuing the downward motion to engage the lead with the contact and produce the bond. Most preferably, the method further includes the step of repeatedly moving the tool and part relative to one another to align the tool with all of the contacts on the part and repeating the bonding step for each contact, the tool being maintained in substantially constant orientation relative to the part during the moving and repeated bonding steps.

The tool desirably has first and second sets of guide surfaces as discussed above. The lead connection sections extending in the first direction are engaged with the first set of guide surfaces during the bonding steps whereas the lead connection sections extending in the second direction are engaged with the second set of guide surfaces during these steps. Each bonding step desirably includes the step of applying vibration to the connection section of the lead being bonded through the tool. The contacts preferably are disposed in rows, and the moving and repeating step includes the step of moving the tool along each row and repeating the bonding step for each lead in each row. Where the contacts of the chip being connected are disposed in rows, such as in rows along the edges of the chip, the connection sections of the leads are also disposed in similar rows, the connection sections of each such row extending side by side. In this case, the moving and repeating step typically includes the step of moving the tool along each row of leads and repeating the bonding step for each lead in the row. Where the contacts, and hence the leads, are disposed in a so-called "area array" the leads are not disposed side by side adjacent to one another but rather are disposed at various locations on the face of the chip. In this case, the bonding step includes the step of moving the tool from location to location and repeating the bonding step for the leads at the various locations.

The tools and methods in accordance with preferred embodiments of the present invention provide convenient and rapid bonding of the leads to the chip. In particular, it is unnecessary to rotate the tool and chip relative to one another during the bonding process. The entire process can be carried out with simple translational movements in orthogonal directions. This materially reduces the cost and complexity of the bonding equipment and materially enhances the speed of the process. These and other objects, features and advantages of the present invention will be more readily apparent from the detailed description of the preferred embodiments set forth below, taken in conjunction with the accompanying drawings.

DETAILED DESCRIPTION OF THE PREFERRED EMBODIMENTS

Figure 1:
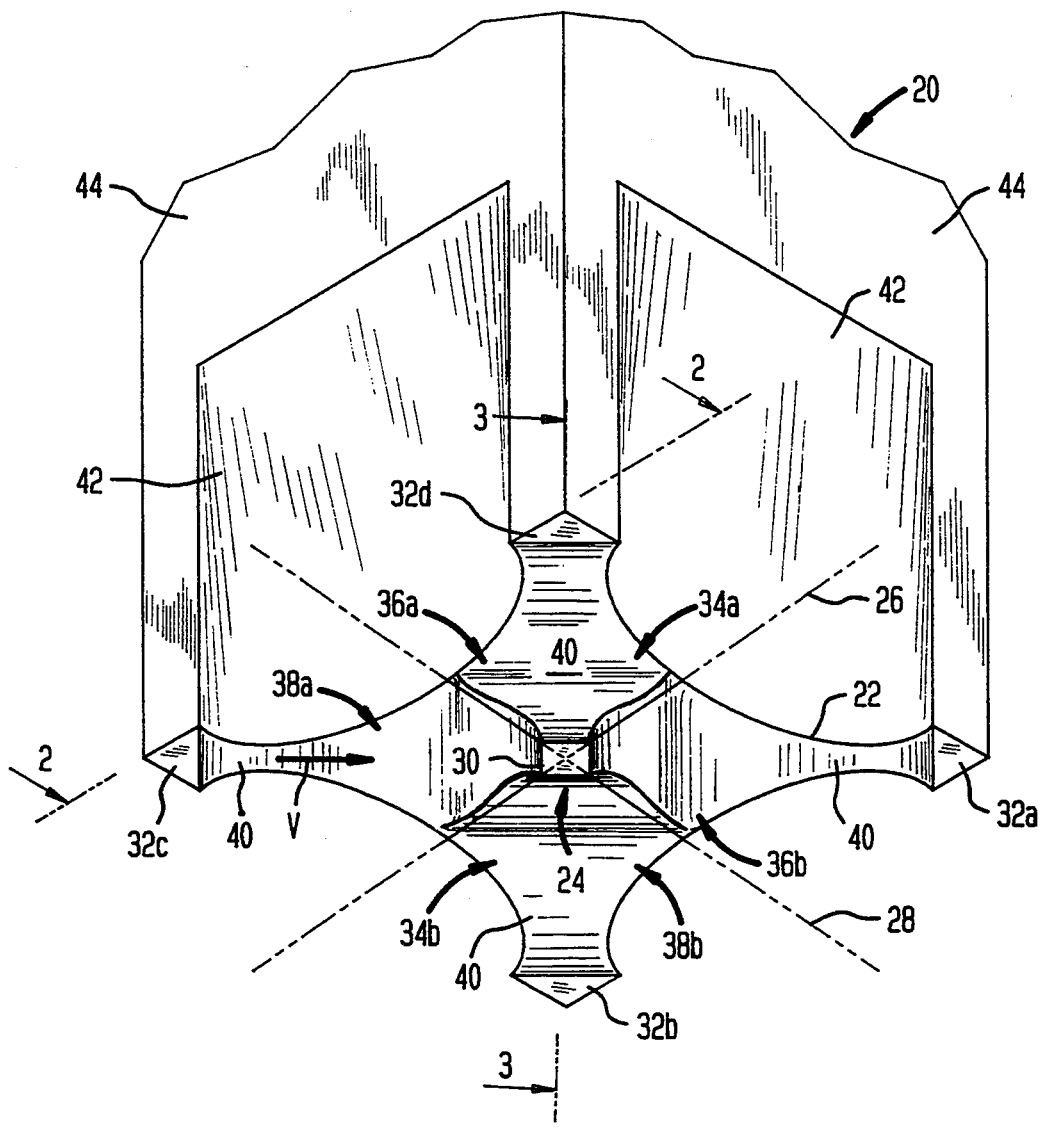
FIG. 1 is a fragmentary diagrammatic perspective view of a bonding tool in accordance with one embodiment of the present invention.

A tool in accordance with one embodiment includes a body 20 having a lower end 22. The lower end 22 has a bottom surface with a central, bonding surface region 24. The tool body defines mutually orthogonal first and second horizontal axes 26 and 28 extending through the bonding surface region 24 on the lower end of the tool. First axis 26 extends in a first horizontal direction, whereas second axis 28 extends in a second horizontal direction. The tool also has a downwardly projecting bump or asperity 30 in bonding region 24, at the intersection of axes 26 and 28. In plan, asperity 30 is generally in the form of a quadrilateral or parallelogram symmetrical about axes 26 and 28 and having its diagonals extending in the directions of these axes.

The tool body further includes four downwardly extending projections 32. Projections 32 are spaced apart from one another in the first and second horizontal directions defined by axis 26 and 28 respectively. Thus, projections 32a and 32d are spaced apart from projections 32b and 32c in the first horizontal direction defined by axis 26, whereas projections 32c and 32d are spaced apart from projections 32a and 32b in the second horizontal direction defined by axis 28. Accordingly, projections 32 surround the bonding region 24 and hence surround asperity 30. Two projections 32 are disposed on each side of axis 26, whereas two projections 32 are also disposed on each side of axis 28.

Figure 2:
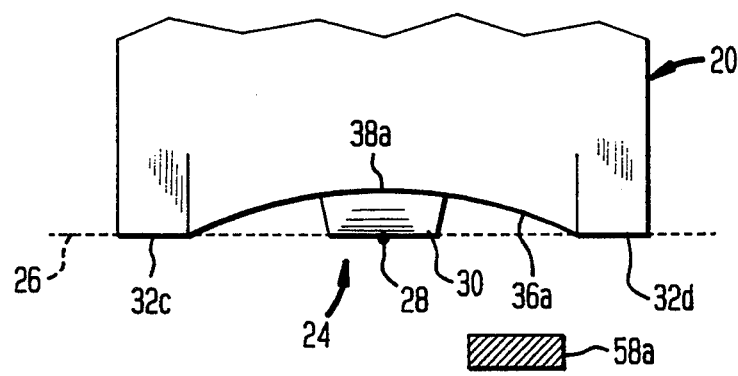
FIG. 2 is a fragmentary diagrammatic elevational view taken along line 2—2 in FIG. 1.
Figure 3:
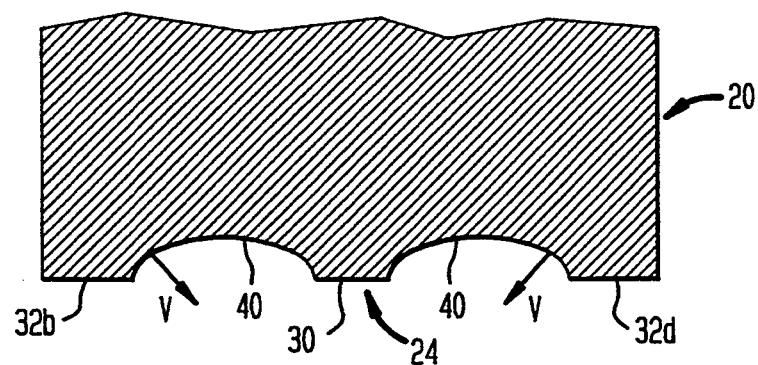
FIG. 3 is a fragmentary sectional view taken along line 3—3 in FIG. 1.

The lower end of the tool further defines two first guide surfaces 34a and 34b disposed on opposite sides of bonding region 24 and extending across first axis 26. Likewise, the lower end of the tool defines two second guide surfaces 36a and 36b disposed on opposite sides of bonding region 24 and extending across second axis 28. As best seen in FIG. 2, second guide surface 36a slopes upwardly from projections 32c and 32d on opposite sides of the second axis 28. The outermost edge of the second guide surface 36a, furthest from the bonding region 24 and hence furthest from the intersection of axes 26 and 28 is bonded by a generally arcuate edge 38a. The second guide surface 36a slopes upwardly from projection 32c in a first direction (a direction along axis 26) towards axis 28. Likewise, surface 36a slopes upwardly from projection 32d in the direction along axis 26 towards axis 28. The other second guide surface 36b likewise slopes upwardly from projections 32a and 32b in the first directions, parallel to axis 26, towards second axis 28, and has a similar arcuate edge 38b. The first guide surfaces 34a and 34b are generally similar, except that these surfaces slope upwardly in the directions parallel to second axis 28, towards first axis 26. The lower end of the tool further defines ramp surfaces extending from projections 32 inwardly towards bonding region 24. Ramp surfaces 40 slope upwardly from projections 32 in the direction towards the bonding region 24 and towards asperity 30. The ramp surfaces 40 are configured so that a vector V normal to ramp surface points in a direction oblique to first and second axes 26 and 28. Likewise, the projection of the normal vector V in the horizontal plane of axes 26 and 28 is also oblique to these axes. Although the various surfaces defined by the lower end of the tool body have been described separately, it should be appreciated that these surfaces in fact merge smoothly with one another so as to provide a substantially continuous lower surface.

The vertically extensive surfaces 42 of the tool body are curved inwardly, in the first and second horizontal directions defined by axis 26 and 28 at their lowermost extremities. Thus, each of edges 38 (at the intersections of guide surfaces 36 with vertical surfaces 42) is curved inwardly toward the central or bonding region 24. The inwardly curved regions of vertical surfaces 42 blend gradually into flat surfaces 44 in the regions remote from lower end 22. The tool further has a shank 46 schematically indicated in FIG. 4 at its upper end, remote from lower end 22. Shank 46 is adapted to engage the tool with the operative end of a conventional thermosonic, thermocompression or ultrasonic bonding machine 48. Although shank 46 is depicted in a form having screw threads, it should be readily appreciated that the particular type of shank depends solely upon the configuration of the machine with which the tool is to be used. Thus, any configuration known in the art for attaching tools to thermosonic, thermocompression or ultrasonic bonding equipment can be utilized. Such configurations include keyed attachments, multi-bolt mounting pads, set screws, and clamping devices.

In a bonding method according to one embodiment of the present invention, tool 20 is held in the bonding machine 48. A semiconductor chip or other similar part 50 having rows of electrical contacts 52 and 54 extending in mutually orthogonal X and Y directions is disposed beneath the tool so that the X-direction rows such as row 52 extend generally parallel to the first axis 26 and hence parallel to the first horizontal direction defined by the tool 20 whereas the second or Y direction rows 54 extend generally parallel to the second axis 28 and hence parallel to the second direction defined by the tool.

Figure 4:
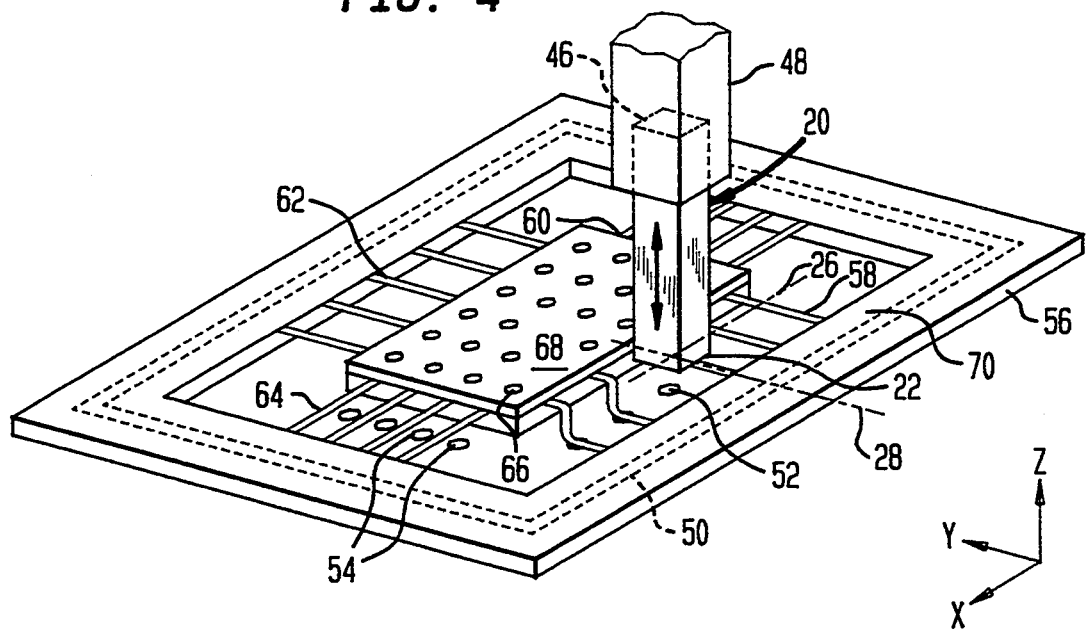
FIG. 4 is a diagrammatic perspective view depicting the tool of FIGS. 1-3 in conjunction with other components during a step of a process in accordance with one embodiment of the invention.

A connection component 56 including a generally sheet-like support structure and four rows of leads 58, 60, 62 and 64 is also employed. The connection component has terminals 66 on an inner portion 68 of the support structure. Each lead in each of rows 58 through 62 has a connection section with first or fixed end permanently connected to the inner portion 68 of the support structure and a second or frangible end adjacent to the outer extremity of the lead. The second ends of the lead connection sections are attached to an outer, ring-like portion 70 of the support structure which surrounds inner portion 68. Thus, the connection sections of the leads extend across a gap 69 between the inner and outer sections of the support structure. The first or fixed end of each lead is connected to one of the terminals 66 on the inner portion 68 of the support structure. As illustrated in FIG. 4, the connection sections of leads in rows 58, 60, 62 and 64 extend in mutually orthogonal directions. Thus, the connection sections of the leads in rows 58 and 62 extend in the second or Y direction. These leads are disposed side-by-side adjacent one another so that rows 58 and 62 extend in the first or X direction. Conversely, the leads of other rows 60 and 64 extend in the first or X direction, but these leads are disposed side-by-side so that the rows 60 and 64 extend in the second or Y direction. The connection component is substantially aligned with the semiconductor chip and with the first and second directions defined by axis 26 and 28 of the bonding tool. The connection sections of the leads overlie the contacts on the semiconductor chip.

In the process, the bonding tool is brought into alignment with an electrical contact, such as a contact 52 on the semiconductor chip 50. The tool is then advanced downwardly, so as to engage one of the leads in row 58. As best seen in FIG. 2, the connection section of lead 58a may initially be out of alignment with the tool, so that the lead is offset somewhat in the first bonding tool direction (the direction of axis 26) from the bonding region and hence offset from the second axis 28 of the tool. However, as the tool moves downwardly, the second guide surfaces 36a and 36b and ramp surfaces 40 (FIG. 1) cooperatively guide the lead and move it in the first bonding tool direction, along axis 26, so that the lead moves transversely to the second axis 28 and comes into alignment with the second axis, thereby aligning the lead with the bonding region 24 on the bottom surface and with the asperity or bump 30 at the center of the bonding region. In this process, the lead moves generally transverse to the direction of elongation of its connection section. Thus, leads of row 58 will move generally in the X direction seen in FIG. 4. With continued downward motion of the bonding tool, the bonding tool forces the lead into engagement with the aligned electrical contact 52 on the chip, and bonds the lead to the contact. In this process, the bonding equipment applies pressure and ultrasonic vibrations to the lead. The bonding process itself may be substantially as described in the '772 application. As the bonding tool forces each lead downwardly relative to the remainder of the connection component, the second or frangible end of the lead breaks away from the outer portion 70 of the support structure. During this process, the outer portion 70 of the support structure desirably is supported at a preselected distance above the chip.

After each lead in row 58 is bonded, the tool is retracted upwardly and the tool is indexed relative to the connection component and chip in the first or X direction, along the length of row 58. This may be accomplished either by moving the tool while keeping the connection component and chip in a fixed position, or by moving the chip and component while keeping the tool in a fixed position. In the indexing or moving step, the tool is brought into alignment with the next lead in row 58 and the bonding process is repeated with such lead. After all of the leads in row 58 have been bonded to the contacts of the chip in this fashion, the tool is indexed further in the X direction to bring it into alignment with row 60. The tool is then indexed in the Y direction relative to the chip and connection component so as to successively align the tool with the various leads in row 60. Here again, each lead is bonded to a contact of the chip by moving the tool downwardly. After each lead is bonded, the tool is further indexed or moved in the second or Y direction, i.e., along the direction defined by axis 28 to align it with a further lead of row 60. As discussed above, the leads in row 60 extend generally in the first or X direction. Thus, the first guide surfaces 34a and 34b, extending across first axis 26, serve to guide each lead in row 60 into alignment with first axis 26, and hence into alignment with the bump or asperity 30 in the bonding section in exactly the same manner as discussed above with reference to the second guide surfaces. The bonding step is repeated for each lead in row 60. Next, the tool is moved along row 62 and the bonding step is repeated again. Inasmuch as the leads of row 60 extend generally in the second or Y direction, the second guide surfaces 36 will engage these leads and bring them into alignment with second axis 28 as discussed above with reference to leads 58. Finally, the tool is indexed along row 64 to bond the leads of that row to the contacts of the chip, such as contacts 54. The leads of row 64 are engaged by the first guide surfaces 34 (FIG. 1) in the same manner as leads in row 60.

During the entire process, the tool and the connection component need not be rotated with respect to one another. Thus, because the tool is capable of aligning leads extending in either direction, the tool can operate on leads of rows 58 and 62 (extending in one direction) and also on leads 60 and 64 (extending in an orthogonal direction) without reorientation. With the leads extending in either orientation, however, the tool effectively aligns the lead with the bonding region of the tool. As discussed in greater detail in the '772 application, the ability of the tool to capture and align the lead with the tool during downward travel provides a significant advantage inasmuch as it is unnecessary to achieve exact precision in the alignment of the leads on the connection component with the contacts of the chip before the bonding operation. If the tool itself is in good alignment with the contacts of the chip, the tool itself will bring the leads into precise alignment with the chip contacts. With a tool as described above, this self-aligning action is achieved for leads extending in either of two orthogonal directions.

Although the discussion above refers to use of the tool with connection components having leads arranged side by side in rows to match rows of contacts on the chip, similar processes can be employed where the contacts of the chip, and hence the leads, are disposed in other patterns. For example, the contacts of the chip may be disposed in a so-called "area array", i.e., an array or grid of contacts covering a substantial portion of the chip surface. In such an area array, the contacts may be arranged in patterns other than rectilinear rows and columns. The connection component typically is provided with apertures at locations matching the locations of the contacts on the chip and with one lead extending over such apertures. The bonding tool is indexed relative to the chip and connection component to bring the tool into alignment with each aperture and lead in sequence. While the tool is aligned with each aperture, the tool is advanced downwardly into the aperture, thereby engaging the lead and forcing the lead into engagement with the contact of the chip. Here again, the leads may extend in either of two orthogonal directions. The tool will nonetheless engage the leads and guide them into precise alignment with the chip contact, provided that the tool itself is properly aligned with the chip contacts. Once again, there is no need to rotate the chip and connection component relative to the tool even where the leads associated with different apertures extend in orthogonal directions.

It is desirable to crumple each lead slightly by displacing the tool, and the section of the lead engaged therewith, towards the fixed or permanently connected end of the lead during the downward displacement and bonding steps, so as to form each lead into a generally S-shaped structure. This serves to limit or eliminate downward pull of the leads on the edge of the central or permanent portion of the connection component 68. These measures may be applied in the use of tools and methods according to this aspect of the present invention. The lead shaping process is described in greater detail in the copending, commonly assigned United States Patent Application of Gary Grube et al. entitled "Shaped Lead Structures and Method", filed of even date herewith, the disclosure of which is hereby incorporated by reference herein.

The tools and methods according to these aspects of the present invention are particularly valuable when applied in connection with structures having multiple leads disposed at closely spaced intervals. Likewise, tools and methods according to these aspects of the present invention can be used with area array type chips and connection components wherein each contact of the chip is associated with a small diameter aperture in the connection component dielectric structure. For in either application, the lower end of the tool desirably has horizontal dimensions less than about 0.3 mm and preferably between about 0.05 mm and about 0.3 mm. The tool can be fabricated from hard, wear-resistant materials such as are commonly used for thermocompression and ultrasonic bonding tools. Among these materials are tool steel, tungsten carbide, osmium, rhodium, ceramics, garnet and diamond. Combinations of several materials can also be employed.

Figure 5:
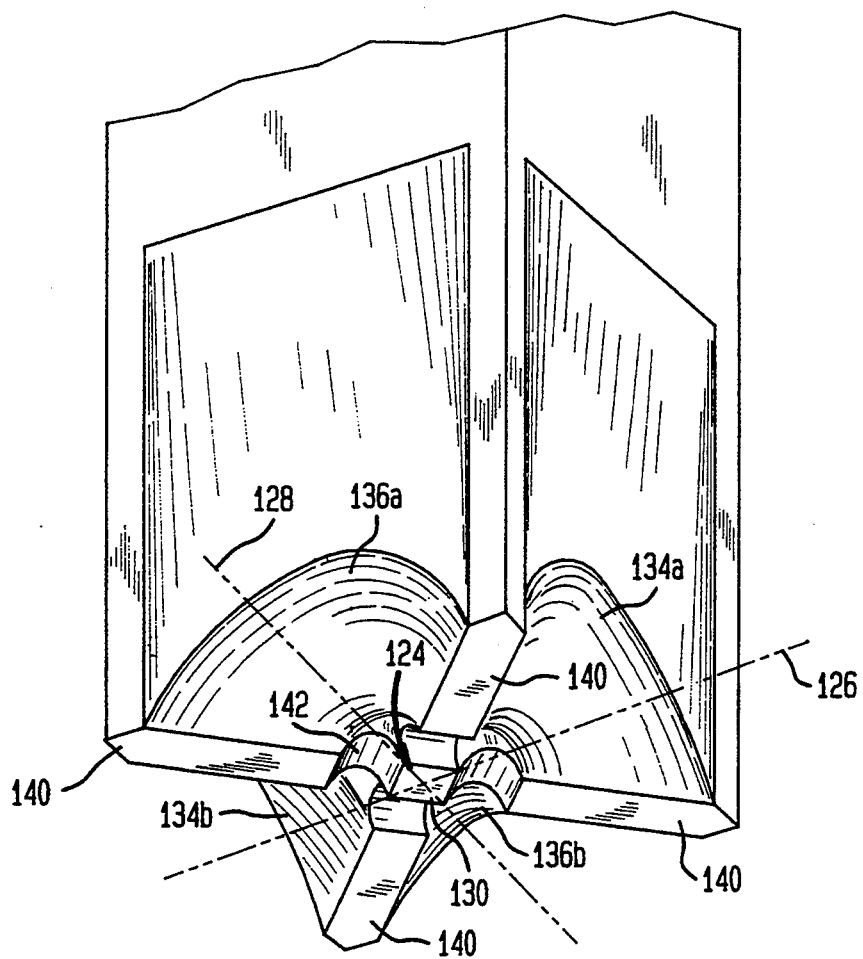
FIGS. 5-7 are diagrammatic perspective views depicting tools according to further embodiments of the present invention.

A bonding tool in accordance with a second embodiment of the invention is partially illustrated in FIG. 5. This tool has a central bonding region 124 on its bottom surface and a pair of mutually orthogonal horizontal axes 126 and 128 extending through the bonding region 124. As in the tool of FIG. 1, there is an asperity or bump 130 in bonding region 124. The tool of FIG. 5 further includes first guide surfaces 134a and 134b extending outwardly away from bonding region 124 along first axis 126, and a pair of second guide surfaces 136, extending outwardly in opposite directions along second axis 128 from the bonding region 124. In the tool of FIG. 5, however, the first guide surfaces 134 are generally arcuate partial surfaces of revolution about first axis 126. The radii of these surfaces increases with distance along first axis 126 away from bonding region 124, so that the outermost portion of each first guide surface 134, at the greatest distance from bonding region 124, has a substantially larger radius than the innermost portion adjacent the bonding region. Likewise, second guide surfaces 136a and 136b are generally in the form of arcuate, partial surfaces of revolution about second axis 128. The radii of these surfaces increases with increasing distance along second axis 128 away from the bonding region 124. Thus, the arcuate first and second guide surfaces flare outwardly away from founding region 124. The lower surface of the bonding tool illustrated in FIG. 5 further has ribs 140 disposed substantially in the same horizontal plane as the lower surface of the asperity 130 in bonding region 124. Ribs 140 extend substantially oblique to axes 126 and 128. Ribs 140 are notched at 142 adjacent the asperity 130 so as to isolate the asperity from the ribs and so as to permit a lead to be fully engaged by the asperity without engagement by the ribs when the lead is accurately aligned with axis 126 or to axis 128.

The tool of FIG. 5 is utilized in substantially the same way as the tool discussed above with reference to FIGS. 1-4. Thus, the tool of FIG. 5 is engaged with an ultrasonic or thermocompression bonding machine in the same manner as discussed above. The guide surfaces 126 and 128 serve to align the leads with the bonding section during downward motion of the tool. Here again, there is no need for reorientation of the tool or of the workpiece.

Figure 6:
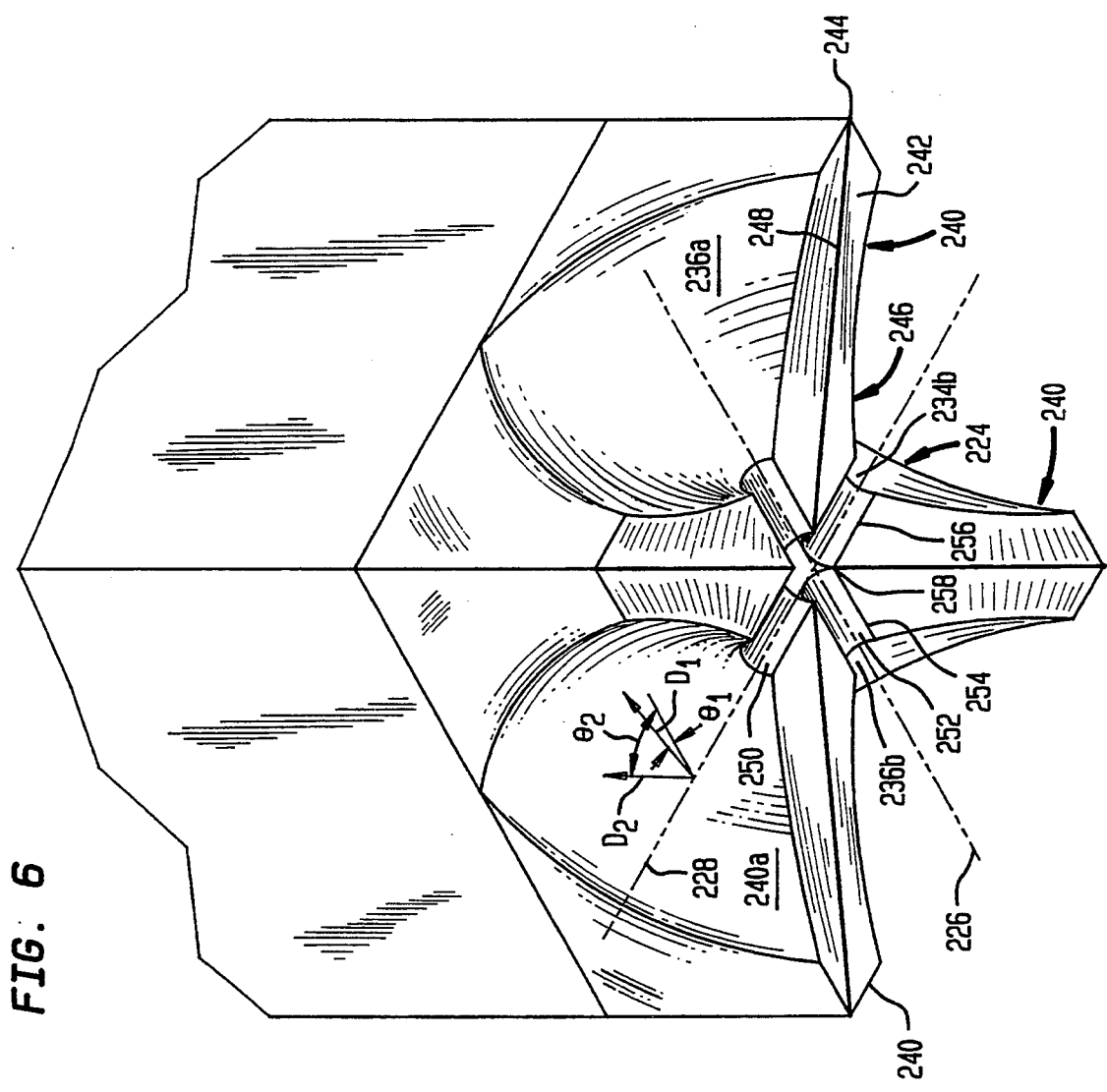

A tool according to a further embodiment of the invention is partially illustrated in FIG. 6. This tool also has a central bonding region 224 at the center of its bottom surface and a pair of mutually orthogonal horizontal axes 226 and 228 extending through the bonding region 224. Like the tool of FIG. 5, the tool of FIG. 6 has a pair of first guide surfaces 234(a) and 234(b) extending along first axis 228, one of these guide surfaces (234(b)) being largely hidden in the depiction of FIG. 6. Similarly, there are a pair of second guide surfaces 236(a) and 236(b) extending along second axis 226. In the tool FIG. 6, each of these guide surfaces flares outwardly, away from the associated axis in the direction away from the central or bonding region 224. The guide surfaces 234 and 236 are not surfaces of revolution about axes 226 and 228. Thus, the distance from the first axis 228 to the first guide surface measured along vectors perpendicular to axis 228 will vary depending upon the orientation of such vectors. For example, the distance D1 from a particular point on first axis 228 to first guide surface 234(a) measured along a first vector at a relatively small angle $\theta_1$ to the horizontal plane is less than the distance $D_2$ from axis 228 to the guide surface measured along a second vector at a greater angle $\theta_2$ to the horizontal plane. Stated another way, at any particular point along first axis 228, the distance to the guide surface in the vertical direction is greater than the distance to the guide surface in the horizontal direction perpendicular to the axis. However, in any given direction (for any given measuring vector angle $\theta$) the distance from the first axis to guide surface 234(a) increases progressively with distance from the central or bonding region 224, i.e., with distance from the intersection of axes 226 and 228. The second guide surfaces are similarly configured, and therefore flare outwardly from second axis 226.

The bottom surface of the tool also has ribs 240 extending outwardly from central or bonding region 224 in directions oblique to the first and second directions, i.e., oblique to axes 226 and 228, preferably at angles of about 45 degrees to these axes so that the ribs 240 lie between the first guide surfaces 234 and the second guide surfaces 236. Each rib 240 has a bottom surface 242 sloping downwardly in the direction along the rib away from central or bonding region 224, i.e., away from the intersection of axes 226 and 228. Thus, the outermost end 244 of each rib is disposed at a lower vertical elevation then the innermost end 246 of the rib. Moreover, the surface of each rib slopes upwardly from the midline of the rib to the edges of the rib and hence slopes upwardly towards the adjacent guide surfaces 234 and 236.

The lower end of the tool body further has a first channel 250 extending through bonding region 224 along first axis 228 and a second channel 252 extending through the bonding region along second axis 226. The channels intersect one another within the bonding region and extend outwardly from the bonding region to the guide surfaces 234 and 236. The channels have generally semicircular cross-sections, and the surfaces of the channels merge smoothly with the first and second guide surfaces. The intersections of the channel surfaces with ribs 240 define edges 254 and 256 at the inner ends of the ribs, these edges intersecting one another at points 258 in the central or bonding region 224.

The tool according to FIG. 6 can be used in the same manner as the tools discussed above. Here, the guide surfaces and the sloping surfaces of the ribs cooperate to guide leads engaged by the tool into alignment with the bonding section. Further, the edges 254 and 256 and points 258 defined by the channels and ribs serve to couple the lead to the tool for application of ultrasonic or other vibrations and for transmission of horizontally directed forces between the tool and the lead. The channels 250 and 252, and hence the edges and points defined by these channels can be omitted, particularly where the tool is forcibly engaged with the lead.

Figure 8:
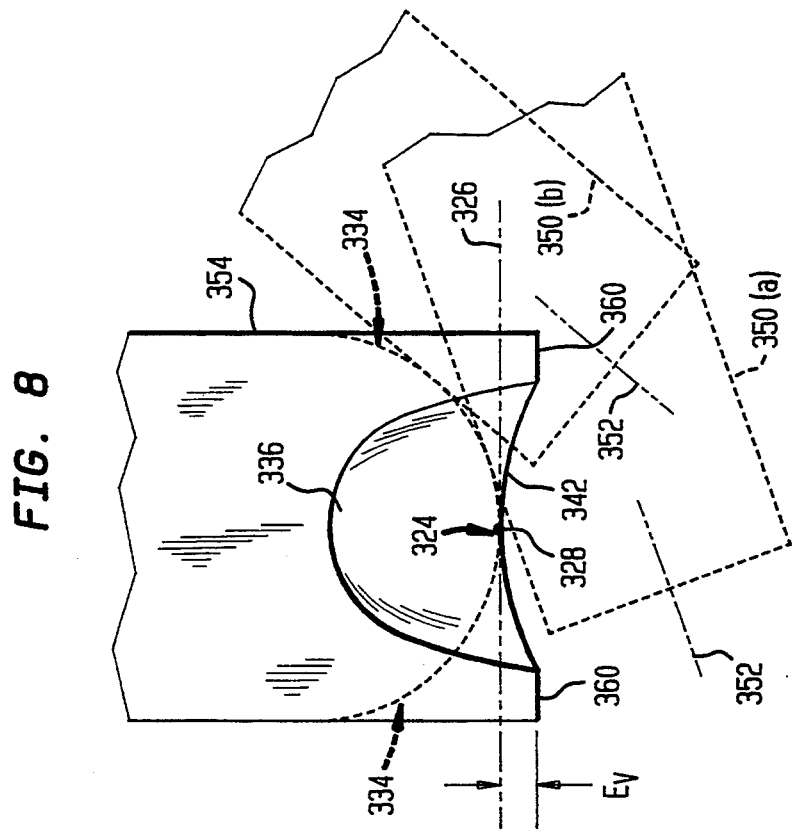
FIG. 8 is a diagrammatic elevational view of the tool shown in FIG. 7.
Figure 7:
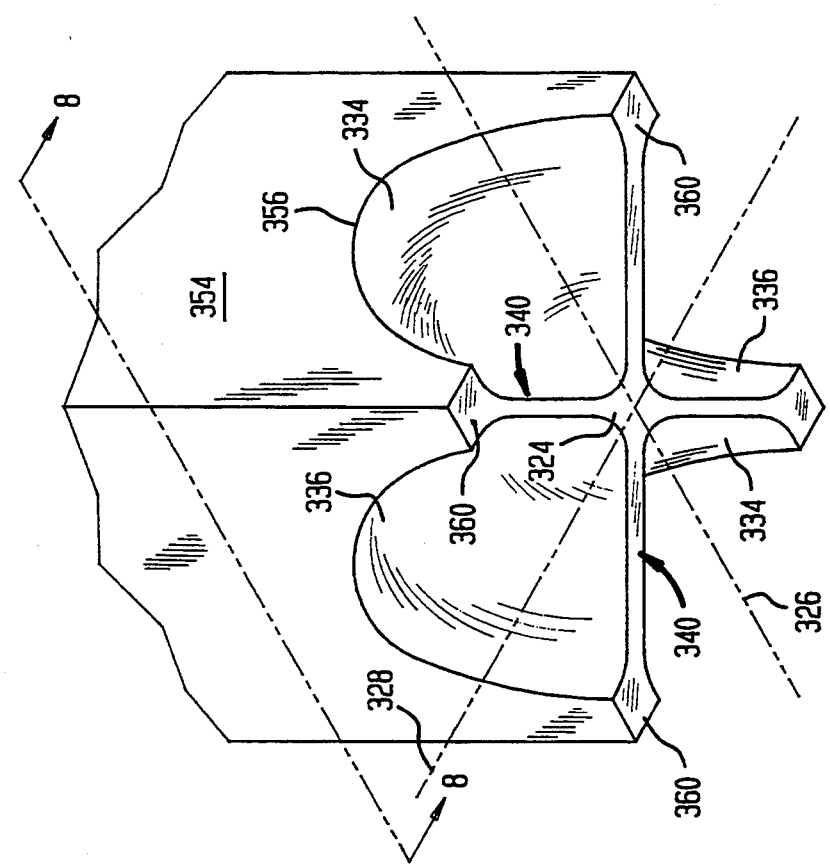
Figure 9:
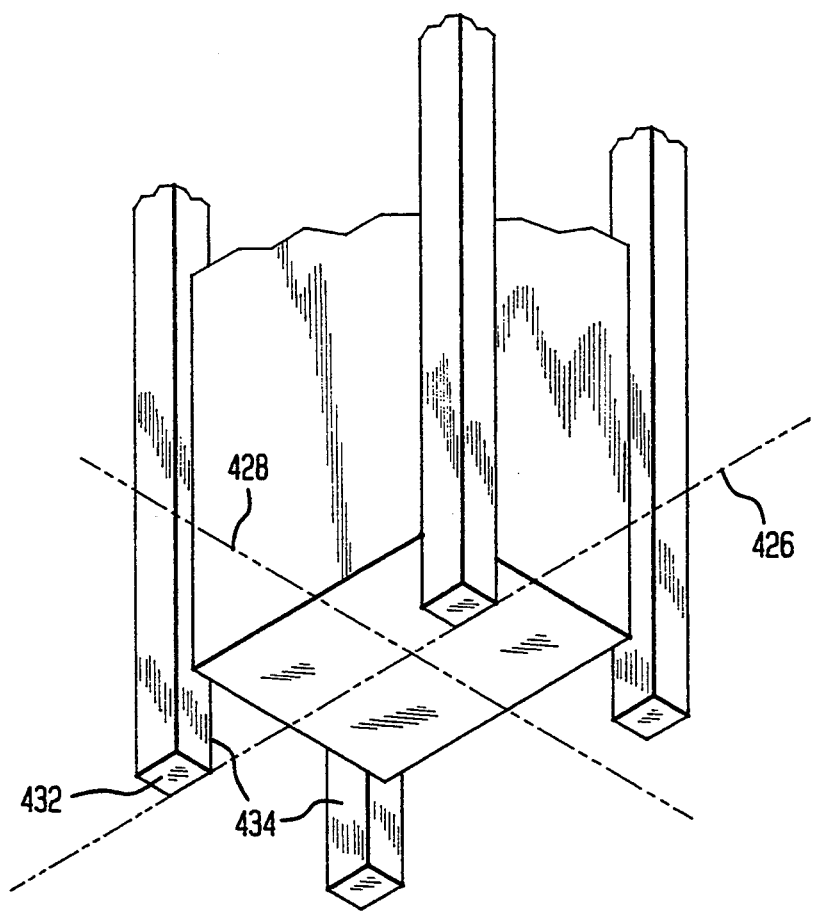
FIG. 9 is a diagrammatic perspective view depicting a tool in accordance with yet another embodiment of the invention.

A tool according to a further embodiment is illustrated in FIGS. 7 and 8. This tool defines first and second orthogonal horizontal axes 326 and 328 intersecting one another in a central or bonding region 324 on the bottom surface of the tool body. Further, the tool has first guide surfaces 334 and second guide surfaces 336 extending along the first and second axes respectively and flaring outwardly away from these axes in the direction away from the central or bonding region 324. Additionally, the tool body has ribs 340 extending in directions oblique to the first and second axes between the first and second guide surfaces. The general arrangement of these elements is similar to the arrangement of the components in the tool of FIG. 6. However, in the tool of FIGS. 7 and 8, the first and second guide surfaces have the shape which would be swept by a cylindrical generating surface, shown in phantom at 350 in FIG. 8, moving from a first orientation 350a in which the axis 352 of the generating surface is horizontal or nearly horizontal and the generating surface contacts the tool body adjacent the central or bonding region 324 (adjacent the intersection of axes 326 and 328) to a second orientation shown in phantom at 350b in which the axis 352 of the generating surface is more nearly vertical and in which the generating surface contacts the tool body at the exterior wall 354 of the body. The generally parabolic curve 356 defined by the intersection between the generating surface in its second orientation and the exterior vertical surface 354 of the tool body constitutes the exterior bounding curve of each guide surface.

Although the generating surface 350 is illustrated only for one of the first guide surfaces 336, it should be clearly appreciated that the same type of generating surface defines each of the other surfaces. For each first guide surface 334, the axis 352 of the cylindrical generating surface always remains perpendicular to second axis 328 (seen in end view in FIG. 8). Conversely, for each of the second guide surfaces 336, the axis of the cylindrical generating surface always remains perpendicular to first axis 326 during its motion. The intersections between the generating surfaces of the various guide surfaces in their respective first orientations define the surfaces 342 of ribs 340. As best seen in FIG. 8, the central or bonding region 324 is recessed vertically above the outermost extremities 360 of the ribs, at the corners of the tool bottom. Stated another way, the lower surfaces 342 of the ribs 340 curve upwardly from the outermost extremities to the central region. The vertical elevation Ev from the lowest point of the tool bottom surface (from the extremities 360 of ribs 340 to the central or bonding region 324) desirably is less than the thickness of the leads to be bonded. Preferably, this vertical elevation is between about 0 and about 0.013 mm.

The tool according to FIGS. 7 and 8 can be fabricated by using a miniature saw or file having a circular cross-section or having a radiused edge as a generating surface. The surface can be physically generated by sawing or filing while rocking the saw or file from a generally horizontal orientation to a generally vertical orientation, so that the saw or file physically cuts the first and second surfaces. Alternatively, the same surface geometry can be generated by methods such as electrical discharge machining, without physically moving a generating surface.

As will be readily appreciated, numerous variations and combinations of the features discussed above can be employed without departing from the present invention as defined by the claims. Merely by way of example, the bottom end of the tool may be provided with guide surfaces having different configurations. However, it is highly desirable that the guide surfaces be arranged to operate with leads extending in either of two mutually orthogonal directions. Thus, other configurations of ramps and projections can be employed provided that they provide the requisite guiding action.

For example in the arrangement of FIG. 7, the projections 432 are provided with inwardly sloping edges 434, each such edge sloping upwardly and inwardly so that the edges 434 will tend to guide leads towards the axes 426 and 428. Thus, these edges will serve to align the leads with the bonding region at the intersection between these axes.

As numerous other variations and combinations of the features set forth above can be utilized without departing from the present invention as defined by the claims, the foregoing description of the preferred embodiment should be taken by way of illustration rather than by way of limitation of the present invention.

What is claimed is:

1. A tool for bonding leads to contacts on semiconductor chips, said tool comprising a body having a lower end defining a bonding surface region, and guide surfaces for engaging elongated leads disposed beneath said lower end upon downward movement of said tool from above such leads, said guide surfaces being adapted to engage an elongated lead extending generally in a first horizontal direction beneath said lower end and guide such lead generally in a second horizontal direction orthogonal to said first horizontal direction so as to align such lead with said bonding region, said guide surfaces also being adapted to engage an elongated lead extending generally in said second horizontal direction beneath said lower end and to guide such lead generally in said first horizontal direction so as to align such lead with said bonding region.

2. A tool as claimed in claim 1 further comprising at least one asperity in said bonding region for coupling the tool to a lead when said lower end is forcibly engaged with a lead.

3. A tool as claimed in claim 2 wherein said at least one asperity is substantially symmetrical about first and second mutually orthogonal axes extending in said first and second directions.

4. A tool as claimed in claim 3 wherein said at least one asperity is generally in the form of a quadrilateral having diagonals extending in said first and second directions.

5. A tool as claimed in claim 1 wherein said body defines mutually orthogonal first and second axes extending through said bonding region in said first and second horizontal directions and four downward projections spaced apart from one another in said first and second horizontal directions so that said projections surround said bonding region and two of said projections are disposed on each side of each of said axes.

6. A tool as claimed in claim 5 wherein said guide surfaces include two first guide surfaces disposed on opposite sides of said bonding region, each first guide surface extending across said first axis and sloping upwardly from said projections on opposite sides of said first axis to said first axis, said guide surfaces further including two second guide surfaces disposed on opposite sides of said bonding region, each second guide surface extending across said second axis and sloping upwardly from said projections on opposite sides of said second axis to said second axis.

7. A tool as claimed in claim 6 wherein said first and second guide surfaces have generally arcuate edges bounding said surfaces on the sides thereof remote from said bonding region.

8. A tool as claimed in claim 6 wherein each of said projections defines a ramp surface sloping upwardly and inwardly towards said bonding region so that such ramp surface defines a normal vector at an angle oblique to said axes.

9. A tool as claimed in claim 1 wherein said body defines mutually orthogonal first and second axes extending through said bonding region in said first and second horizontal directions, said guide surfaces including a pair of first guide surfaces extending generally along the first axis, each said first guide surface flaring outwardly away from the first axis with progressively increasing distance from the bonding region, said guide surfaces further including a pair of second guide surfaces extending generally along the second axis, each said second guide surface flaring outwardly away from the second axis with progressively increasing distance from the bonding region.

10. A tool as claimed in claim 9 wherein said first and second guide surfaces are generally in the form of partial surfaces of revolution about said first and second axes, respectively, and wherein the radii of said surfaces of revolution increase progressively with distance from said bonding region.

11. A tool as claimed in claim 9 wherein said body further defines first and second downwardly-facing channels on said lower end extending in said first and second horizontal directions and intersecting one another in said bonding region.

12. A tool as claimed in claim 9 wherein said lower end of said body further defines ribs having extending at angles oblique to said first and second directions between said first guide surfaces and said second guide surfaces.

13. A tool as claimed in claim 12 wherein said ribs slope downwardly with progressively increasing distance from said bonding region.

14. A tool as claimed in claim 1 wherein said lower end of said body has horizontal dimensions less than about 0.3 mm.

15. A method of making connections to contacts on the front surface of a part of a semiconductor chip assembly comprising the steps of:
  (a) juxtaposing a connection component having leads with elongated connection sections extending in mutually orthogonal first and second directions with the part so that a bottom surface of a support structure in said connection component faces the front surface of the part and so that the connection sections of the leads on the connection component overly said contacts on said chip in crude alignment therewith;
  (b) bonding the connection section of each said lead to one said contact by aligning a tool with the contact to be bonded and displacing the tool downwardly to engage the lead with the tool and thereby bring the connection section into more precise alignment with the contact, and continuing said downward motion to engage the lead with the contact; and
  (c) moving said tool and part relative to one another to align the tool with all of said contacts seriatim and repeating said bonding step for each contact, said tool being maintained in substantially constant orientation relative to said part during said moving and repeated bonding steps.

16. A method as claimed in claim 15 wherein said tool has a first and second sets of guide surfaces, said connection sections extending in said first direction being engaged with said first set of guide surfaces during said bonding step, said connection sections extending in said second direction being engaged with said second set of guide surfaces during said bonding step.

17. A method as claimed in claim 15 wherein said bonding step includes the step of applying vibrations to each said connection section through said tool.

18. A method as claimed in claim 15 wherein said contacts are disposed in rows and wherein said moving and repeating step includes the step of moving said tool along each said row.

19. A method as claimed in claim 15 wherein said contacts are disposed in an array on said part, said connection component includes a dielectric component having a plurality of apertures, one such aperture being aligned with each contact on the part, said connection sections of said leads extending over said apertures, said moving step including the step of aligning said tool with said apertures in sequence.

* * * * *